(12) United States Patent
Inoue

(10) Patent No.: US 6,687,863 B1
(45) Date of Patent: Feb. 3, 2004

(54) INTEGRATED CIRCUIT INTERNAL SIGNAL MONITORING APPARATUS

(75) Inventor: Takao Inoue, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/674,018

(22) PCT Filed: Jul. 29, 1999

(86) PCT No.: PCT/JP99/04103

§ 371 (c)(1),
(2), (4) Date: Jul. 11, 2001

(87) PCT Pub. No.: WO01/13135

PCT Pub. Date: Feb. 22, 2001

(51) Int. Cl.[7] .......................... G11C 29/00; G01R 31/28
(52) U.S. Cl. ...................................... 714/723; 714/724
(58) Field of Search ................................ 714/723, 724

(56) References Cited

U.S. PATENT DOCUMENTS

| | | | | |
|---|---|---|---|---|
| 4,450,560 A | * | 5/1984 | Conner | 714/736 |
| 4,876,685 A | * | 10/1989 | Rich | 714/723 |
| 5,109,505 A | * | 4/1992 | Kihara | 714/5 |
| 5,285,323 A | * | 2/1994 | Hetherington et al. | 711/122 |
| 5,379,300 A | | 1/1995 | Yamahata et al. | |
| 5,465,257 A | | 11/1995 | Yamahata et al. | |
| 5,596,530 A | * | 1/1997 | Lin et al. | 365/185.3 |

FOREIGN PATENT DOCUMENTS

| | | |
|---|---|---|
| JP | 61-133867 | 6/1986 |
| JP | 4-171542 | 6/1992 |
| JP | 5-34416 | 2/1993 |
| JP | 6-201787 | 7/1994 |
| JP | 8-63374 | 3/1996 |

* cited by examiner

Primary Examiner—Albert Decady
Assistant Examiner—Joseph D. Torres
(74) Attorney, Agent, or Firm—Snell & Wilmer, LLP

(57) ABSTRACT

An integrated circuit internal signal monitoring apparatus comprises an integrated circuit. The integrated circuit comprises a signal change information generating section for detecting changes in a plurality of internal signals to be monitored in a circuit block, and in response to a level of at least one of the plurality of internal signals changing sequentially generating flags indicating the internal signal whose level has been changed, the post-change level, and that the levels of other internal signals have not been changed; a storage section for sequentially storing the flags and a trigger generating section for generating a write stop trigger signal for stopping a write operation of the flags to the storage section The integrated circuit internal signal monitoring apparatus further comprises an internal signal waveform reproduction section for reading the flags from the storage section after the generation of the write stop trigger signal.

5 Claims, 3 Drawing Sheets

INTEGRATED CIRCUIT INTERNAL SIGNAL MONITORING APPARATUS

TECHNICAL FIELD

The present invention relates to an integrated circuit internal signal monitoring apparatus, in particular, an apparatus characterized by a read operation of a plurality of internal states without increasing the number of input/output pins provided in a large scale integrated circuit (hereinafter, referred to as an LSI) system.

BACKGROUND ART

Conventionally, an integrated circuit internal signal monitoring apparatus as described in Japanese Patent No. 2580558 is known.

A conventional integrated circuit internal signal monitoring apparatus will be described with reference to FIG. 3. In order to monitor from outside an internal operation of a circuit block 12 provided in an LSI 11, a selector 19 is provided. The circuit block 12 has its original function. The selector 19 receives signals 21 to be monitored among signals inside the circuit block 12 as inputs, and also receives a selection signal 31 from outside the LSI 11 through an input pin, thus to designate the specific signal to be monitored. Based on the value of the selection signal 31, the selector 19 selects a plurality of signals 32 from the input signals 21 and outputs the signals 32 to outside the LSI 11 through an output pin, so that the signals can be monitored.

However, the conventional structure described above has the following problem. When signals driven inside the LSI 11 are monitored outside through the LSI output pins, a large number of output pins for monitoring and the selection signal input pins are required, as the number of the signals to be simultaneously monitored increases. Therefore, the number of pins in the entire LSI 11 increases.

Furthermore, when monitoring the LSI internal signals from outside the LSI 11 with a logic analyzer or the like, a signal analysis performed with the internal states of the LSI as event conditions requires even the internal signals relating to the event conditions to be output externally. This causes a problem of a further increase in the number of the input/output pins.

DISCLOSURE OF THE INVENTION

An integrated circuit internal signal monitoring apparatus according to the present invention includes: an integrated circuit, including: signal change information generating means for detecting changes in a plurality of internal signals to be monitored in a circuit block, and for, when a level of at least one of the plurality of internal signals is changed, sequentially generating flags indicating the internal signal whose level has been changed, the post-change level, and that the levels of other internal signals have not been changed, storage means for sequentially storing the flags generated by the signal change information generating means, and trigger generating means for generating a write stop trigger signal for stopping a write operation of the flags to the storage means; and internal signal waveform reproduction means for reading the flags from the storage means after the generation of the write stop trigger signal, and reproducing waveforms of the plurality of internal signals. Thus, the above-described problems are solved.

The storage means includes a ring buffer, and the flags may be sequentially stored in the ring buffer in a time series.

The trigger generating means may generate the write stop trigger signal when a value of one of the plurality of internal signals and an expected value of a signal input from outside the integrated circuit match each other.

According to one aspect of the present invention, LSI internal signals around a required point can be monitored with a significantly smaller number of input/output pins compared to the prior art, and debug can easily be performed based on a signal state around a generation time of external events and internal events.

According to another aspect of the present invention, only a signal change point value is stored to a storage device, and information of the storage device is read from outside to form waveforms as necessary. Thus, the number of LSI input/output pins can be reduced, and, in a system incorporating an LSI, the system can easily be debugged by monitoring an internal signal state with the time to monitor being specified.

According to still another aspect of the present invention, the capacity of storage means can be reduced, and an internal signal state of an LSI system can be monitored without increasing the number of LSI input/output pins, and thus system debug is easily performed.

BEST MODE FOR CARRYING OUT THE INVENTION

Hereinafter, an embodiment according to the present invention will be described with reference to FIGS. 1 and 2.

Figure 1:
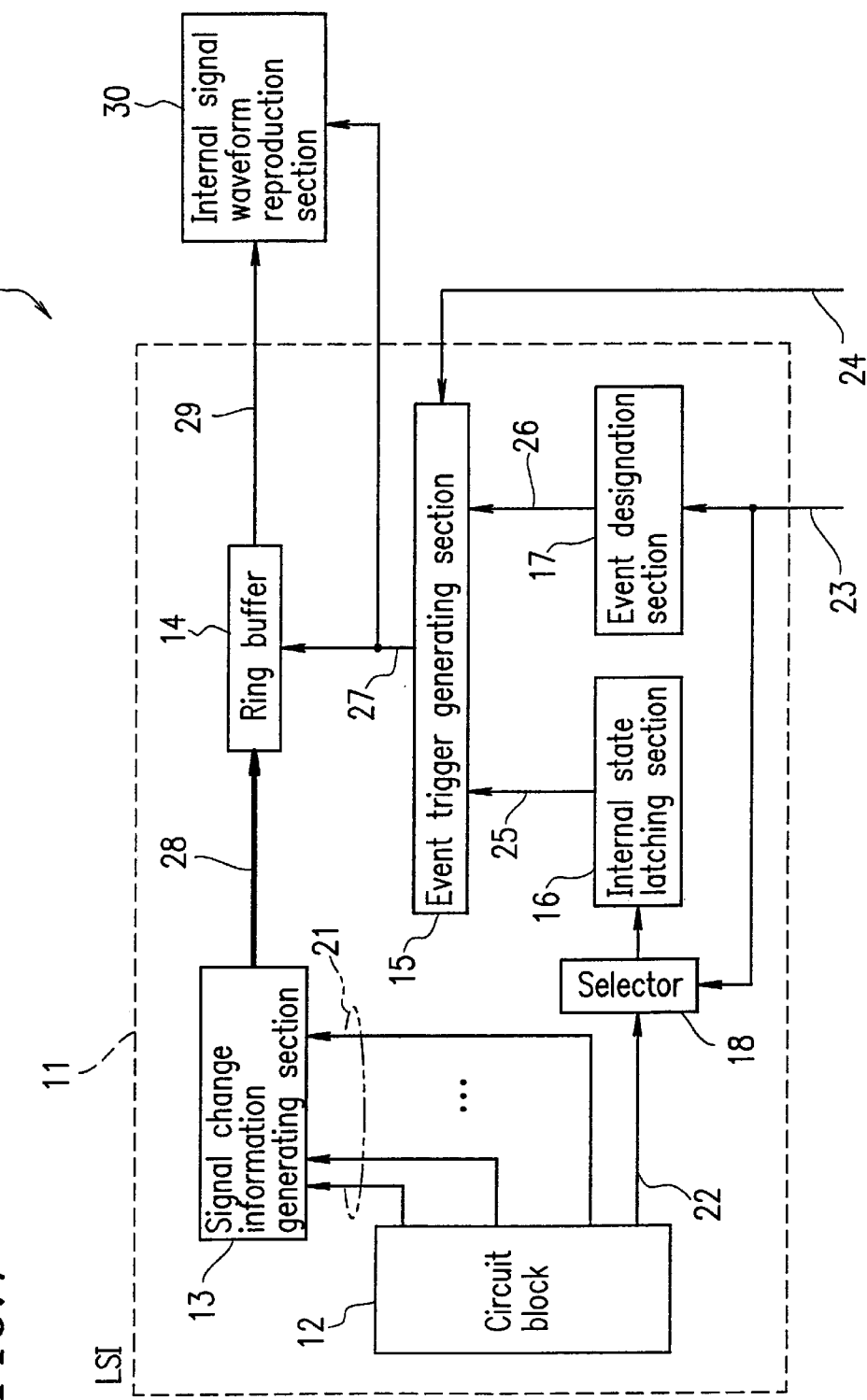
FIG. 1 is a block diagram of an integrated circuit internal signal monitoring apparatus according to an embodiment of the present invention.
Figure 2:
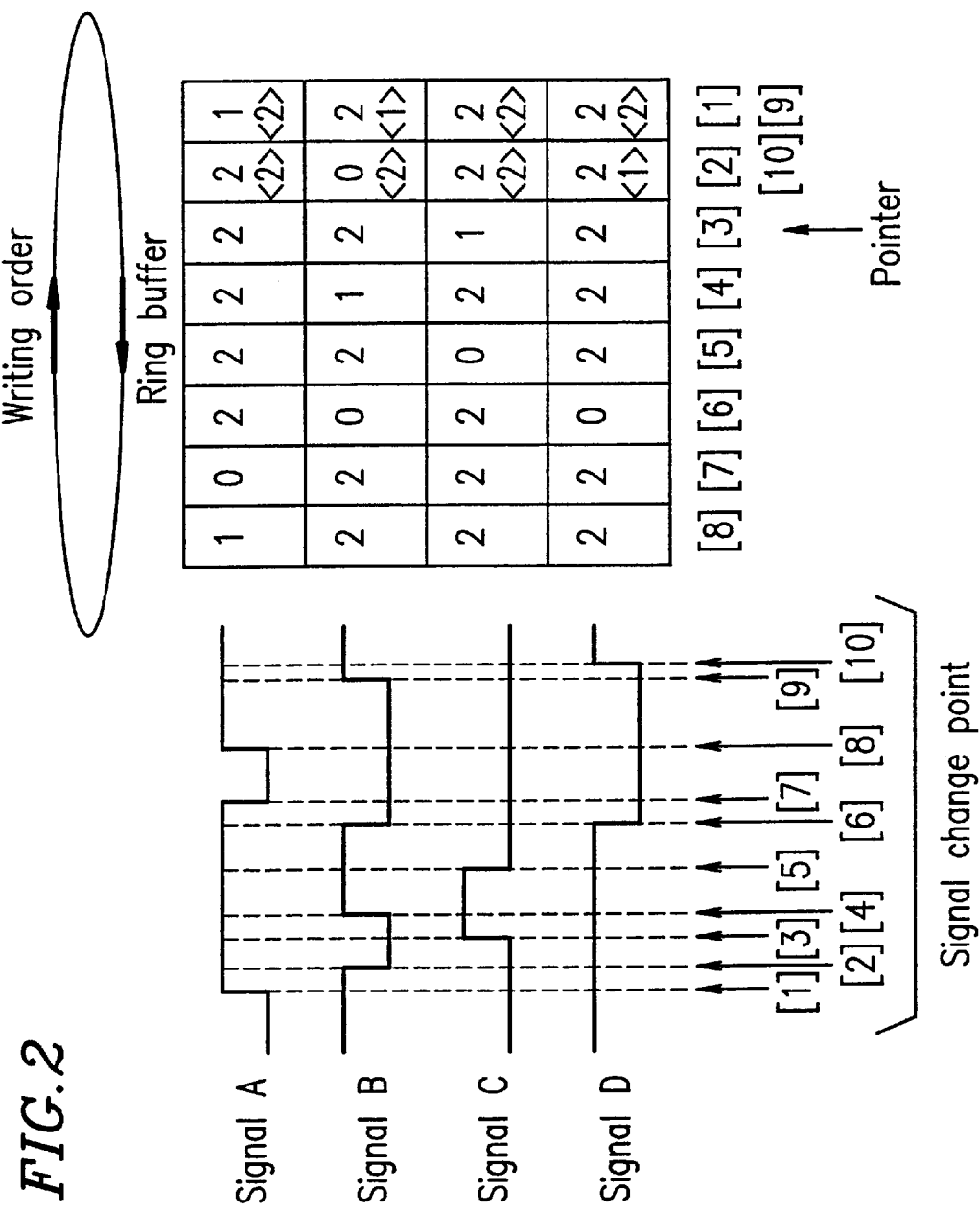
FIG. 2 shows a waveform diagram of signals to be monitored by the integrated circuit internal signal monitoring apparatus according to the embodiment of the present invention and a diagram for schematically illustrating a recording state of a ring buffer.
Figure 3:
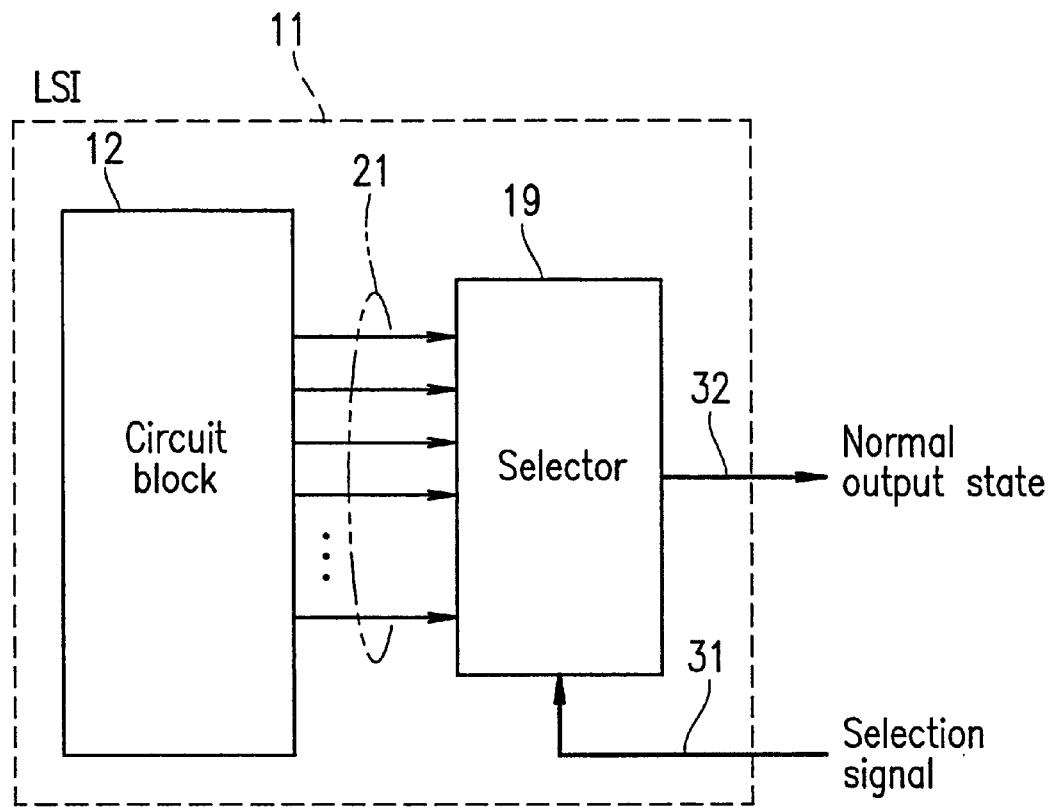
FIG. 3 is a block diagram of a conventional integrated circuit internal signal monitoring apparatus.

FIG. 1 illustrates a block structure of an LSI internal signal monitoring apparatus 100 according to the present invention. FIG. 2 illustrates a waveform diagram and storage contents for illustrating an operation of recording signal change information of internal signals to be monitored of an LSI 11 to a storage device.

In order to monitor from outside an internal operation of a circuit block 12 provided in the LSI 11, signals 21 as monitoring targets inside the circuit block 12 are processed with a structure described below. The circuit block 12 has its original function. The signals 21 as monitoring targets are input to a signal change information generating section 13. When an arbitrary signal, among all the signals 21 as monitoring targets, changes, flags 28 indicating the signal level immediately after the change, and that the other signals have not been changed, are generated, and are sequentially stored in a ring buffer 14. The timing to stop a write operation to the ring buffer 14 depends on a write stop trigger signal 27, which is output from an event trigger generating section 15.

Next, a process of an event trigger generation will be described. There are two types of trigger events; one is based on a change in a signal 24 from outside the LSI 11, and the other is based on a change in an internal signal 22 of the circuit block 12. In the former case, the write stop trigger signal 27 is generated based on the change in the signal 24 from outside. In the latter case, the write stop trigger signal 27 is generated based on the change in the internal signal 22. In more detail, a signal used for a trigger event is selected from the internal signals 22 by using a selector 18 based on an event designation signal 23 set from outside the LSI 11 and stored in an internal state latching section 16. An expected value of the signal selected by the event designation signal 23 is written to an event designation section 17. A signal value 25 which is to be a trigger factor and an expected signal value 26 written to the event designation section are continuously compared by the event trigger generating section 15, and when the signal values 25 and 26 match, the trigger signal 27 is output.

The write stop trigger signal 27 output by the event trigger generating section 15 stops the write operation of the flag information 28 to the ring buffer 14. The write stop trigger signal 27 is output to an internal signal waveform reproduction section 30, and thus, the information that the write operation to the ring buffer 14 has been stopped is sent to the internal signal waveform reproduction section 30. The internal signal waveform reproduction section 30 provided outside the LSI 11 reads out read information 29 from the ring buffer 14. The read operation can also be performed by using a single serial pin. The internal signal waveform reproduction section 30 reproduces an internal signal waveform based on the read information 29.

Next, a write operation of the flag 28 will be described with reference to FIG. 2. The flag 28 is write information to be written to the ring buffer 14 (having 8 locations) for storing the signal change information of the internal signals of the LSI 11 to be monitored. It is assumed that 4 types of signals are input to the signal change information generating section 13. First, at point [1] where signal A changes from "L" to "H", other signals B, C, and D do not change. Therefore, the flag 28, which is the write information to be written to the ring buffer 14, is "1" for signal A immediately after a rise, indicating "H", and "2" for the other signals, indicating that the level has not been changed. Next, at point [2] where signal B changes from "H" to "L", the flag 28 as the write information to be written to the ring buffer 14 is "0" for signal B immediately after a fall, indicating "L", and "2" for the other signals, indicating that the level has not been changed. Thereafter, flag information at the signal change points are sequentially written to the ring buffer 14 in a similar manner.

After the flag is written for the final point [8] of the ring buffer 14, at the next change point [9], the flag information at point [9]("1" for signal B, and "2" for the other signals) is written over the leading information of the ring buffer 14. In this example, an address pointer of the ring buffer 14 points to the pointer position in the figure in the state where the flag information up to the state at change point [10] has been written to the ring buffer 14. In the case where the event trigger generating section 15 outputs the write stop trigger signal 27 at this point, the write operation of the flag information 28 to the ring buffer 14 stops. Then, for reading the information of the ring buffer 14 from outside, the output flag information 29 is read in the order of [3], [4], [5], [6], [7], [8], [9], and [10], starting from the pointer. Thus, waveforms of signals A, B, C, and D can be reproduced.

INDUSTRIAL APPLICABILITY

As described above, according to the present invention, it is possible to reduce the number of input/output pins used, regardless of the number of internal control signals to be monitored, and thus to provide an integrated circuit internal signal monitoring apparatus which is capable of simultaneously monitoring a large number of signals. Compared to the prior art, a chip size of the LSI can be smaller. When a system including the LSI is debugged, trigger generation and signal analysis using an external logic analyzer not required. Therefore, a phase relation of the inner control signals around the event trigger generation time can easily be analyzed.

What is claimed is:

1. An integrated circuit internal signal monitoring apparatus, comprising:
    an integrated circuit, comprising:
        signal change information generating means for detecting changes in a plurality of internal signals to be monitored in a circuit block, and in response to a level of at least one of the plurality of internal signals changing, and for sequentially generating flags indicating the internal signal whose level has been changed, the post-change level, and that the levels of other internal signals have not been changed,
        storage means for sequentially storing the flags generated by the signal change information generating means, and
        trigger generating means for generating a write stop trigger signal for stopping a write operation of the flags to the storage means, and
    internal signal waveform reproduction means for reading the flags from the storage means in response to the generation of the write stop trigger signal, and reproducing waveforms of the plurality of internal signals.

2. An integrated circuit internal signal monitoring apparatus according to claim 1, wherein the storage means includes a ring buffer, and the flags are sequentially stored in the ring buffer in a time series.

3. An integrated circuit internal signal monitoring apparatus according to claim 1, wherein the trigger generating means generates the write stop trigger signal when a value of one of the plurality of internal signals and an expected value of a signal input from outside the integrated circuit match each other.

4. An integrated circuit internal signal monitoring apparatus according to claim 1, wherein the integrated circuit further comprises a selector for selecting one of the internal signals and inputting the selected internal signal into the trigger generating means for use as a trigger factor in generating the write stop trigger signal.

5. An integrated circuit internal signal monitoring apparatus according to claim 4, wherein the selector selects one of the internal signals in response to an event designation signal input from outside the integrated circuit.

* * * * *